United States Patent
Yoo et al.

(10) Patent No.: US 9,312,227 B2
(45) Date of Patent: Apr. 12, 2016

(54) METHOD OF JOINING SEMICONDUCTOR SUBSTRATE

(71) Applicant: Hyundai Motor Company, Seoul (KR)

(72) Inventors: Ilseon Yoo, Seoul (KR); Hiwon Lee, Seoul (KR); Soon-myung Kwon, Gyeonggi-do (KR); Hyunsoo Kim, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/445,653

(22) Filed: Jul. 29, 2014

(65) Prior Publication Data

US 2015/0187704 A1    Jul. 2, 2015

(30) Foreign Application Priority Data

Dec. 30, 2013   (KR) .................. 10-2013-0167810

(51) Int. Cl.
*H01L 23/544* (2006.01)
*H01L 23/00* (2006.01)
*H01L 21/311* (2006.01)
*H01L 21/027* (2006.01)

(52) U.S. Cl.
CPC .......... *H01L 23/544* (2013.01); *H01L 21/0272* (2013.01); *H01L 21/31133* (2013.01); *H01L 21/31144* (2013.01); *H01L 24/83* (2013.01); *H01L 2223/54426* (2013.01); *H01L 2224/83139* (2013.01); *H01L 2224/83201* (2013.01); *H01L 2224/83902* (2013.01)

(58) Field of Classification Search
USPC ................................................. 438/445, 462
See application file for complete search history.

(56) References Cited

U.S. PATENT DOCUMENTS

| 8,119,498 | B2 | 2/2012 | Mengi et al. |
| 2006/0049408 | A1* | 3/2006 | Sohn et al. ............ 257/72 |
| 2014/0139924 | A1* | 5/2014 | Warashina et al. ...... 359/578 |

FOREIGN PATENT DOCUMENTS

| JP | 11-266005 A | 9/1999 |
| JP | 2000-091174 A | 3/2000 |
| JP | 2005-079070 A | 3/2005 |
| KP | 10-2012-0126210 A | 11/2012 |
| KR | 10-2003-0094454 A | 12/2003 |
| KR | 10-2011-0134114 A | 12/2011 |

* cited by examiner

*Primary Examiner* — Pamela E Perkins
(74) *Attorney, Agent, or Firm* — Mintz Levin Cohn Ferris Glovsky and Popeo, P.C.; Peter F. Corless

(57) ABSTRACT

A method of joining semiconductor substrates, which may include: forming an alignment key on a first semiconductor substrate; forming an insulating layer on the first semiconductor substrate and the alignment key; forming a first metal layer pattern and a second metal layer pattern on the insulating layer; forming a first protrusion and a second protrusion, and an alignment recess positioned between the first protrusion and the second protrusion on a second semiconductor substrate; forming a third metal layer pattern and a fourth metal layer pattern on the first protrusion and the second protrusion, respectively; and joining the first semiconductor substrate and the second semiconductor substrate, in which the alignment key is positioned at the alignment recess when the first semiconductor substrate and the second semiconductor substrate are joined, is provided.

7 Claims, 6 Drawing Sheets

METHOD OF JOINING SEMICONDUCTOR SUBSTRATE

CROSS-REFERENCE TO RELATED APPLICATION

This application claims priority to and the benefit of Korean Patent Application No. 10-2013-0167810 filed in the Korean Intellectual Property Office on Dec. 30, 2013, the entire contents of which are incorporated herein by reference.

TECHNICAL FIELD

The present elates to a method of joining semiconductor substrates. More particularly, the present invention provides a method of joining semiconductor substrates in which metal layers are formed.

BACKGROUND

In general, a metal layer and an insulating layer are deposited or a micro pattern is formed on one semiconductor substrate to form a semiconductor device. Further, the semiconductor device may be formed by joining two or more semiconductor substrates on which a thin film layer, such as the metal layer and the insulating layer, and the micro pattern may be formed.

As used herein, the semiconductor substrate or a wafer may be a substrate obtained by cultivating a semiconductor raw material and single-crystallizing the semiconductor raw material like a rod, thinly die-cutting the single-crystallized semiconductor a material according to crystal orientation, and grinding and polishing the die-cut semiconductor raw material. When two or more semiconductor substrates are joined, an error may be generated during alignment of the semiconductor substrates. In general, in the alignment of the semiconductor substrates, alignment keys formed in the semiconductor substrates may be adjusted by using an optical measurement method to join the semiconductor substrates. However, as reported in the related arts, a fine error may also be generated. Further, an alignment error may be generated by heat expansion during a plurality of joining processes, or a metal layer may reflow by heat or pressure during the joining, thereby causing a defect.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention may provide a technical solution to prevent a metal layer from reflowing when semiconductor substrates, in which the metal layer is formed, are joined.

In an exemplary embodiment of the present invention, a method of joining semiconductor substrates may include: forming an alignment key on a first semiconductor substrate; forming an insulating layer on the first semiconductor substrate and the alignment key; forming a first metal layer pattern and a second metal layer pattern on the insulating layer; forming a first protrusion and a second protrusion, and an alignment recess positioned between the first protrusion and the second protrusion on a second semiconductor substrate; forming a third metal layer pattern and a fourth metal layer pattern n the first protrusion and the second protrusion, respectively; and joining the first semiconductor substrate and the second semiconductor substrate. In particular, the alignment key is positioned at the alignment recess when the first semiconductor substrate and the second semiconductor substrate are joined.

In an exemplary embodiment, the joining of the first semiconductor substrate and the second semiconductor substrate may include forming joined metal layers by joining the first metal layer pattern and the third metal layer pattern, and joining the second metal layer pattern and the fourth metal layer pattern. In an exemplary embodiment, a thickness of the alignment key may be greater than a thickness of the joined metal layers.

In an exemplary embodiment, the forming of the alignment key may include: forming a first photoresist film pattern on the first semiconductor substrate; and etching the first semiconductor substrate by using the first photoresist film pattern as a mask.

In an exemplary embodiment, the forming of the first metal layer pattern and the second metal layer pattern may include: forming a second photoresist film pattern on the insulating layer; forming a first metal layer on the insulating layer and the second photoresist film pattern; and removing the second photoresist film pattern and the first metal layer positioned on the second photoresist film pattern by performing a lift-off process.

In an exemplary embodiment, the forming of the first protrusion, the second protrusion, and the alignment recess may include: forming a third photoresist film pattern on the second semiconductor substrate; and etching the second semiconductor substrate by using the third photoresist film pattern as a mask.

In an exemplary embodiment, the forming of the third metal layer pattern and the fourth metal layer pattern on the insulating layer may include: forming a fourth photoresist film pattern on the second semiconductor substrate, except for the first protrusion and the second protrusion; forming a second metal layer on the fourth photoresist film pattern, the first protrusion, and the second protrusion; and removing the fourth photoresist film pattern and the second metal layer positioned on the fourth photoresist film pattern by performing a lift-off process.

According to various exemplary embodiments of the present invention, the alignment key may be positioned at the alignment recess when the first semiconductor substrate and the second semiconductor substrate are joined, thereby joining the first semiconductor substrate and the second semiconductor substrate without an alignment error. In addition, a thickness of the alignment key may be larger than a thickness of the joined metal layers, thereby preventing the metal layers from reflowing and flowing down to be connected with each other when the first semiconductor substrate and the second semiconductor substrate are joined.

Other aspects of the invention are disclosed infra.

BRIEF DESCRIPTION OF THE DRAWINGS

The above and other objects, features and advantages of the present invention will be more clearly understood from the following detailed description taken in conjunction with the accompanying drawing.

FIG. 1 schematically illustrates a first semiconductor substrate 100 and a first photoresist film pattern 50 formed on the first semiconductor substrate 100 according to an exemplary embodiment of the present invention.

FIG. 2 schematically illustrates an alignment key 110 formed by etching the first semiconductor substrate 100 by using the first photoresist film pattern 50 as a mask according to an exemplary embodiment of the present invention.

FIG. 3 schematically illustrates an insulating layer 120 formed on the first semiconductor substrate 100 and the alignment key 110, after the first photoresist film pattern 50 is removed according to an exemplary embodiment of the present invention.

FIG. 4 schematically illustrates a second photoresist film pattern 60 formed on the insulating layer 120, and a first metal layer 130 may be formed on the insulating layer 120 and the second photoresist film pattern 60 according to an exemplary embodiment of the present invention.

FIG. 5 schematically illustrates a first metal pattern 131 and the second metal pattern 132 formed on the insulating layer 120 according to an exemplary embodiment of the present invention.

FIG. 6 schematically illustrates a second semiconductor substrate 200, a third photoresist film pattern 70 formed on the second semiconductor substrate 200 according to an exemplary embodiment of the present invention. Further, an alignment recess 210, a first protrusion 211, and a second protrusion 212 formed on the second semiconductor substrate 200 are formed by etching according to an exemplary embodiment of the present invention.

FIG. 7 schematically illustrates a fourth photoresist film pattern 80 is formed on the second semiconductor substrate 200, a second metal layer 220 formed on the second semiconductor substrate 200 and the fourth photoresist film pattern 80 according to an exemplary embodiment of the present invention.

FIG. 8 schematically illustrates a third metal layer pattern 221 and a fourth metal layer pattern 222 may be formed on the first protrusion 211 and the second protrusion 212, respectively, after the fourth photoresist film pattern 80 is removed according to an exemplary embodiment of the present invention.

FIG. 9 schematically illustrates that the first semiconductor substrate 100 and the second semiconductor substrate 200 are joined according to an exemplary embodiment of the present invention.

Figure 1:
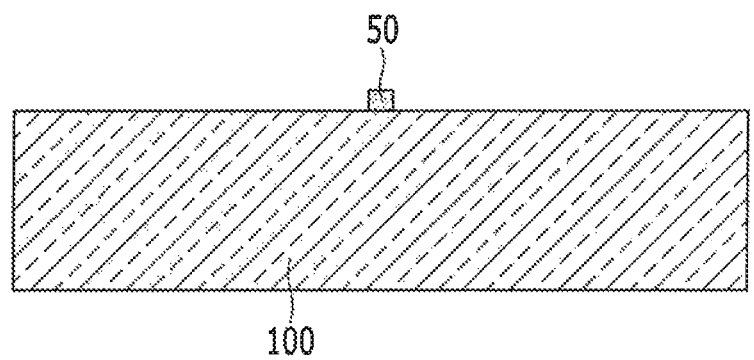
FIGS. 1 to 9 are cross-sectional views illustrating exemplary processes of a method of joining semiconductor substrates according to an exemplary embodiment of the present invention.

Reference numerals set forth in the FIGS. 1-9 include reference to the following elements as further discussed below:

| | |
|---|---|
| 100: First semiconductor substrate | 110: Alignment key |
| 120: Insulating layer | 130: First metal layer |
| 131: First metal layer pattern | 132: Second metal layer pattern |
| 200: Second semiconductor substrate | 210: Alignment recess |
| 211: First protrusion | 212: Second protrusion |
| 220: Second metal layer | 221: Third metal layer pattern |
| 222: Fourth metal layer pattern | 300: Joined metal layer |

DETAILED DESCRIPTION

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

Exemplary embodiments of the present invention will be described in detail with reference to the accompanying drawings. As those skilled in the art would realize, the described embodiments may be modified in various different ways, all without departing from the spirit or scope of the present invention. The exemplary embodiments that are disclosed herein are provided so that the disclosed contents may become thorough and complete and the spirit of the present invention may be sufficiently understood to a person of an ordinary skill in the art.

In the drawings, the thickness of layers and regions are exaggerated for clarity. In addition, in the case when it is mentioned that a layer is present "on" the other layer or a substrate, the layer may be directly formed on the other layer or the substrate or a third layer may be interposed therebetween. Like reference numerals designate like constituent elements throughout the specification.

A process of joining semiconductor substrates according to an exemplary embodiment of the present invention will be described with reference in FIGS. 1 to 9.

Hereinafter, an exemplary method of joining two semiconductor substrates will be described in detail. However, the present invention may not be limited thereto, and three or more semiconductor substrates may be jointed by the joining method.

FIGS. 1 to 9 are cross-sectional views illustrating exemplary processes of the method of joining semiconductor substrates according to an exemplary embodiment of the present invention.

In FIG. 1, a first semiconductor substrate 100 may be prepared, and subsequently a first photoresist film pattern 50 may be formed on the first semiconductor substrate 100.

Figure 2:
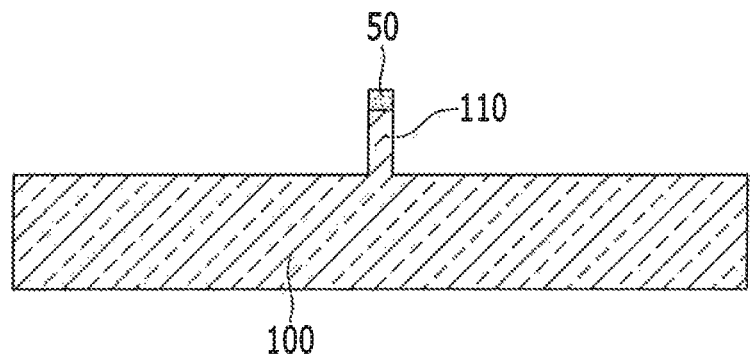

In FIG. 2, an alignment key 110 may be formed by etching the first semiconductor substrate 100 by using the first photoresist film pattern 50 as a mask. The etching may be performed through dry etching or wet etching, without limitation. In particular, the alignment key 110 may formed by etching the first semiconductor substrate 100, and a material for forming the alignment key 110 may not be required.

Figure 3:
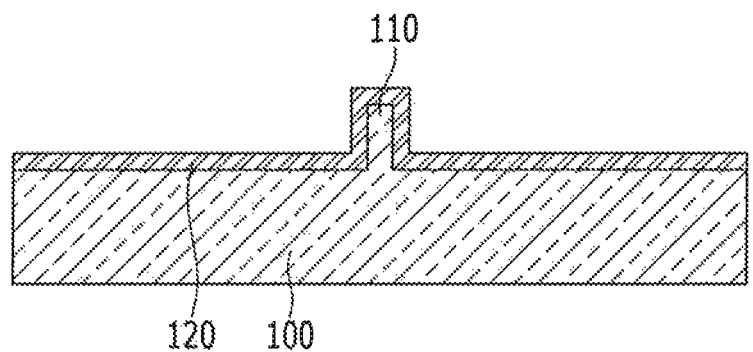

In FIG. 3, after the first photoresist film pattern 50 is removed, an insulating layer 120 may be formed on the first semiconductor substrate 100 and the alignment key 110. Particularly, the insulating layer 120 may be formed of an insulating material, including silicon oxide ($SiO_2$), without limitation.

Figure 4:
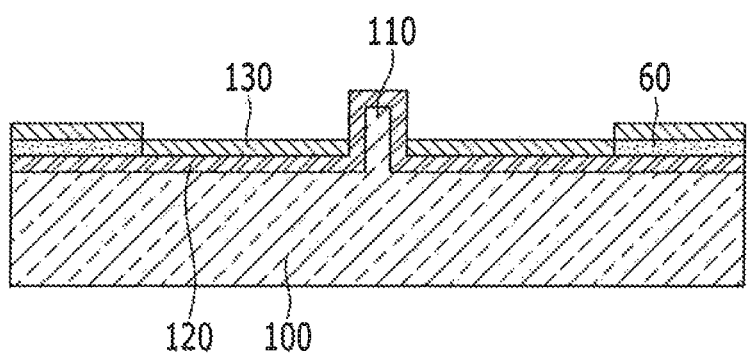

In FIG. 4, a second photoresist film pattern 60 may be formed on the insulating layer 120, and subsequently a first metal layer 130 may be formed on the insulating layer 120 and the second photoresist film pattern 60.

Figure 5:
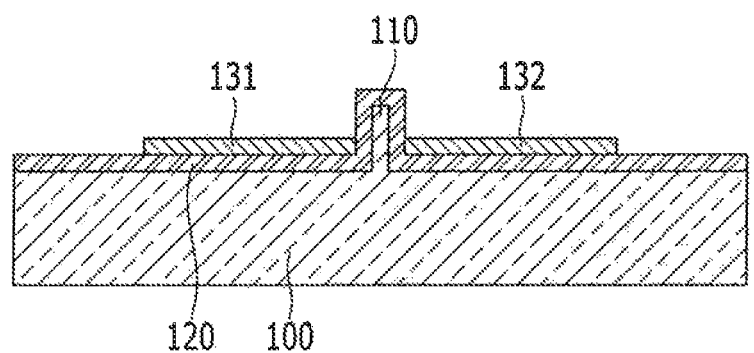

In FIG. 5, the second photoresist film pattern 60 may be removed from the first semiconductor substrate 100 by performing a lift-off process. In addition, the first metal layer 130 positioned on the second photoresist film pattern 60 may be removed. Accordingly, the first metal pattern 131 and the second metal pattern 132 may be formed on the insulating layer 120. In various exemplary embodiments of the present invention, the first metal pattern 131 and the second metal pattern 132 may be formed by the lift-off process without using a mask, without limitation. In addition, the first metal pattern 131 and the second metal pattern 132 may be formed by using a mask. In another exemplary embodiments, after the first metal layer 130 is formed on the insulating layer 120, the first metal pattern 131 and the second metal pattern 132 may be formed by etching the first metal layer 130 by using a mask.

Figure 6:
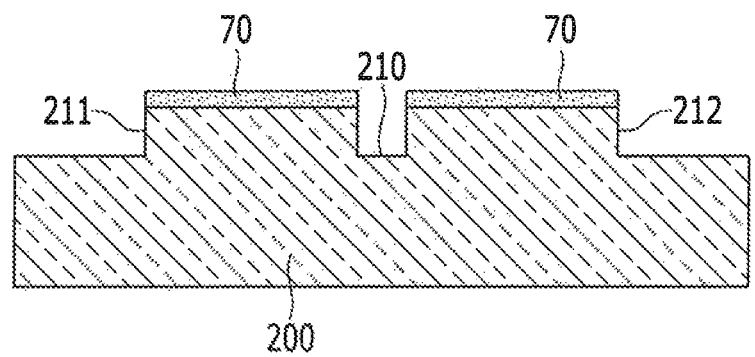

In FIG. 6, a second semiconductor substrate 200 may be prepared, a third photoresist film pattern 70 may be formed on the second semiconductor substrate 200. Subsequently, the second semiconductor substrate 200 may be etched by using the third photoresist film pattern 70 as a mask, without limitation. In particular, the etching may be performed through dry etching or wet etching, without limitation. Through the etching, an alignment recess 210, a first protrusion 211, and a second protrusion 212 may be formed on the second semiconductor substrate 200. The alignment recess 210 may be positioned between the first protrusion 211 and the second protrusion 212.

Figure 7:
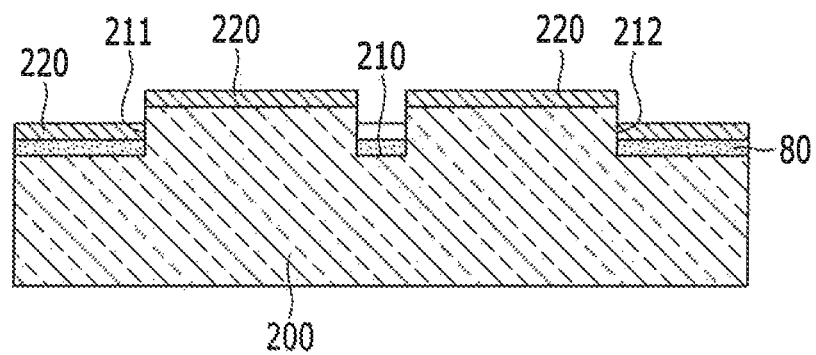

In FIG. 7, after a fourth photoresist film pattern 80 is formed on the second semiconductor substrate 200, a second metal layer 220 may be formed on the second semiconductor substrate 200 and the fourth photoresist film pattern 80. In another exemplary embodiments, the fourth photoresist film pattern 80 may not be formed in the first protrusion 211 and the second protrusion 212 of the second semiconductor substrate 200. Accordingly, only the second metal layer 220 may be formed on the first protrusion 211 and the second protrusion 212 of the second semiconductor substrate 200.

Figure 8:
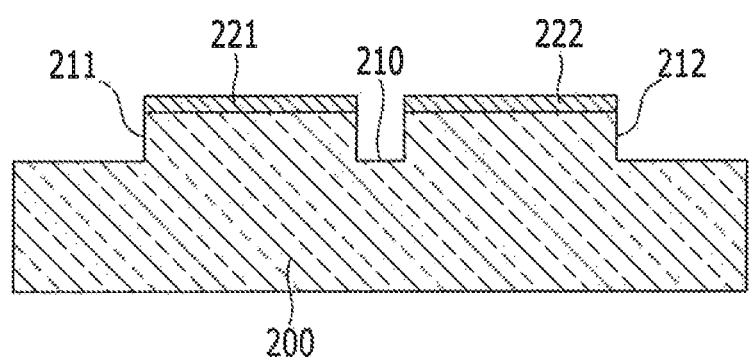

In FIG. 8, the fourth photoresist film pattern 80 may be removed from the second semiconductor substrate 200 by the lift-off process. In addition, the second metal layer 220 positioned on the fourth photoresist film pattern 80 may be removed. Accordingly, a third metal layer pattern 221 and a fourth metal layer pattern 222 may be formed on the first protrusion 211 and the second protrusion 212 of the second semiconductor substrate 200, respectively. According to various exemplary embodiments of the present invention, the third metal layer pattern 221 and the fourth metal layer pattern 222 may be formed by the lift-off process without using a mask, without limitation, or the third metal layer pattern 221 and the fourth metal layer pattern 222 may also be formed by using a mask. In another exemplary embodiments, the second metal layer 220 may be formed on the second semiconductor substrate 200 without forming the fourth photoresist film pattern 80, and then the third metal layer pattern 221 and the fourth metal layer pattern 222 may be formed by etching the second metal layer 220 by using a mask.

Figure 9:
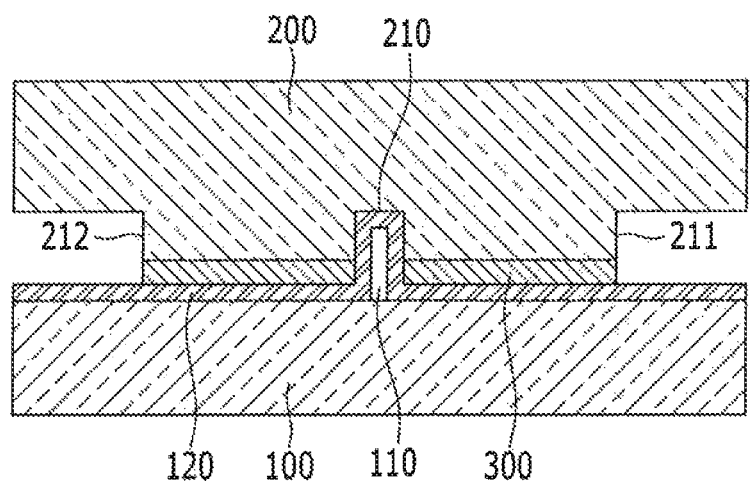

In FIG. 9, the first semiconductor substrate 100 and the second semiconductor substrate 200 may be joined. The alignment key 110 positioned in the first semiconductor substrate 100 may be positioned at the alignment recess 210 of the second semiconductor substrate 200. In particular, the alignment key 110 may be positioned at the alignment recess 210 when the first semiconductor substrate 100 and the second semiconductor substrate 200 are joined, thereby joining the first semiconductor substrate 100 and the second semiconductor substrate 200 without an alignment error.

According to various exemplary embodiments, when the first semiconductor substrate 100 and the second semiconductor substrate 200 are joined, the first metal layer pattern 131 and the third metal layer pattern 221 may be joined, and the second metal layer pattern 132 and the fourth metal layer pattern 222 may be joined, thereby forming joined metal layers 300. Further, in various exemplary embodiments, a thickness of the alignment key 110 may be greater than that of the joined metal layers 300.

In the related arts, when the first semiconductor substrate 100 and the second semiconductor substrate 200 are joined, heat and pressure may be generated. Moreover, when the first metal layer pattern 131 and the third metal layer pattern 221 are joined, and the second metal layer pattern 132 and the fourth metal layer pattern 222 are joined, heat and pressure may be generated. Therefore, the joined metal layers 300 may reflow and flow down by the heat and the pressure and the reflow joined metal layers 300 may flow down and be connected with each other.

In contrast, according to various exemplary embodiments of the present invention, since the alignment key 110 may be positioned in the alignment recess 210 disposed between the first protrusion 211 and the second protrusion 212, and the thickness of the alignment key 110 may be greater than the thickness of the joined metal layers 300, the joined metal layers 300 may be prevented from being connected with each other, although the joined metal layers 300 may reflow and flow down. Accordingly, when the semiconductor device is formed by joining the first semiconductor substrate 100 and the second semiconductor substrate 200, a defect of the semiconductor device may be prevented.

In addition, in exemplary embodiments of the present invention, a plurality of semiconductor devices may be generally formed in the semiconductor substrate. Accordingly, a plurality of alignment keys 110 may be formed in the first semiconductor substrate 100. Moreover, a plurality of alignment recesses 210 corresponding to the alignment keys 110 may also be formed in the second semiconductor substrate 200.

As mentioned above, exemplary processes of the method of joining the two semiconductor substrates according to various exemplary embodiments of the invention are described, but the present invention is not limited thereto. For example, three or more semiconductor substrates may be joined by the aforementioned joining method. For example, another alignment recess may be formed on an opposite surface of a portion in which the alignment recess 210 of the second semiconductor substrate 200 is formed, and then, another substrate, such as a third semiconductor substrate, in which a alignment key and a metal layer is formed may be joined to the second semiconductor substrate 200. In particular, the alignment key of the third semiconductor substrate may be positioned to another alignment recess of the second semiconductor substrate 200.

While this invention has been described in connection with what is presently considered to be exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of joining semiconductor substrates, comprising:
    forming an alignment key on a first semiconductor substrate;
    forming an insulating layer on the first semiconductor substrate and the alignment key;
    forming a first metal layer pattern and a second metal layer pattern on the insulating layer;

forming a first protrusion and a second protrusion, and an alignment recess positioned between the first protrusion and the second protrusion on a second semiconductor substrate;

forming a third metal layer pattern and a fourth metal layer pattern on the first protrusion and the second protrusion, respectively; and joining the first semiconductor substrate and the second semiconductor substrate, wherein the alignment key is positioned in the alignment recess when the first semiconductor substrate and the second semiconductor substrate are joined, wherein the insulating layer contacts the alignment key and the alignment recess.

2. The method of claim 1, wherein said joining of the first semiconductor substrate and the second semiconductor substrate includes:

forming joined metal layers by joining the first metal layer pattern and the third metal layer pattern, and joining the second metal layer pattern and the fourth metal layer pattern.

3. The method of claim 1, wherein a thickness of the alignment key is greater than a thickness of the joined metal layers.

4. The method of claim 1, wherein said forming of the alignment key includes:

forming a first photoresist film pattern on the first semiconductor substrate; and etching the first semiconductor substrate by using the first photoresist film pattern as a mask.

5. The method of claim 1, wherein said forming of the first metal layer pattern and the second metal layer pattern includes:

forming a second photoresist film pattern on the insulating layer;

forming a first metal layer on the insulating layer and the second photoresist film pattern; and removing the second photoresist film pattern and the first metal layer positioned on the second photoresist film pattern by performing a lift-off process.

6. The method of claim 1, wherein said forming of the first protrusion, the second protrusion, and the alignment recess includes:

forming a third photoresist film pattern on the second semiconductor substrate; and etching the second semiconductor substrate by using the third photoresist film pattern as a mask.

7. The method of claim 1, wherein said forming of the third metal layer pattern and the fourth metal layer pattern on the insulating layer includes:

forming a fourth photoresist film pattern on the second semiconductor substrate, except for the first protrusion and the second protrusion;

forming a second metal layer on the fourth photoresist film pattern, the first protrusion, and the second protrusion; and removing the fourth photoresist film pattern and the second metal layer positioned on the fourth photoresist film pattern by performing a lift-off process.

* * * * *